United States Patent [19]
Pettijohn et al.

[11] Patent Number: 5,149,954
[45] Date of Patent: Sep. 22, 1992

[54] HOLD CAPACITOR TIME DELAY AND INTEGRATION WITH EQUILIBRATING MEANS

[75] Inventors: Kevin L. Pettijohn; Todd E. Sessler; John A. Stineman, all of Goleta, Calif.

[73] Assignee: Santa Barbara Research Center, Goleta, Calif.

[21] Appl. No.: 675,231

[22] Filed: Mar. 26, 1991

[51] Int. Cl.$^5$ .............................................. H01J 40/14
[52] U.S. Cl. .................................... 250/208.1; 357/30
[58] Field of Search ............ 250/208.1, 213 R, 213 A; 357/30 L, 30 M, 30 N, 24 L, 24 R, 61; 307/311

[56] References Cited

U.S. PATENT DOCUMENTS

| | | | |
|---|---|---|---|
| 4,300,062 | 11/1981 | Marshall, Jr. | 307/311 |
| 4,870,293 | 9/1989 | Elabd | 357/24 |
| 4,922,337 | 5/1990 | Hunt et al. | 250/208.1 |
| 4,970,567 | 11/1990 | Ahlgren et al. | 357/30 |

Primary Examiner—David C. Nelms
Assistant Examiner—S. Allen

[57] ABSTRACT

Method and apparatus for performing a TDI function with a plurality of electrical signals. A first step of the method stores, during individual ones of a first plurality of consecutive time intervals, a sample of a first electrical signal. A second step of the method equilibrates, during individual ones of a second, subsequent plurality of time intervals, one of the stored samples with a stored sample of a second electrical signal. Subsequent to each of the steps of equilibrating, an electrical signal is outputted that has a magnitude expressive of the equilibrated stored samples. The equilibration is achieved by shorting storage capacitors ($C_1$, $C_2$, $C_3$) together to effectively sum coherent signals and incoherent noise. The charge sum is stored on a capacitance that is effectively doubled from either detector channel operating individually. The output signal remains in the same range as would be an individual detector channel output voltage, without TDI, and no reduction in dynamic range is incurred.

14 Claims, 4 Drawing Sheets

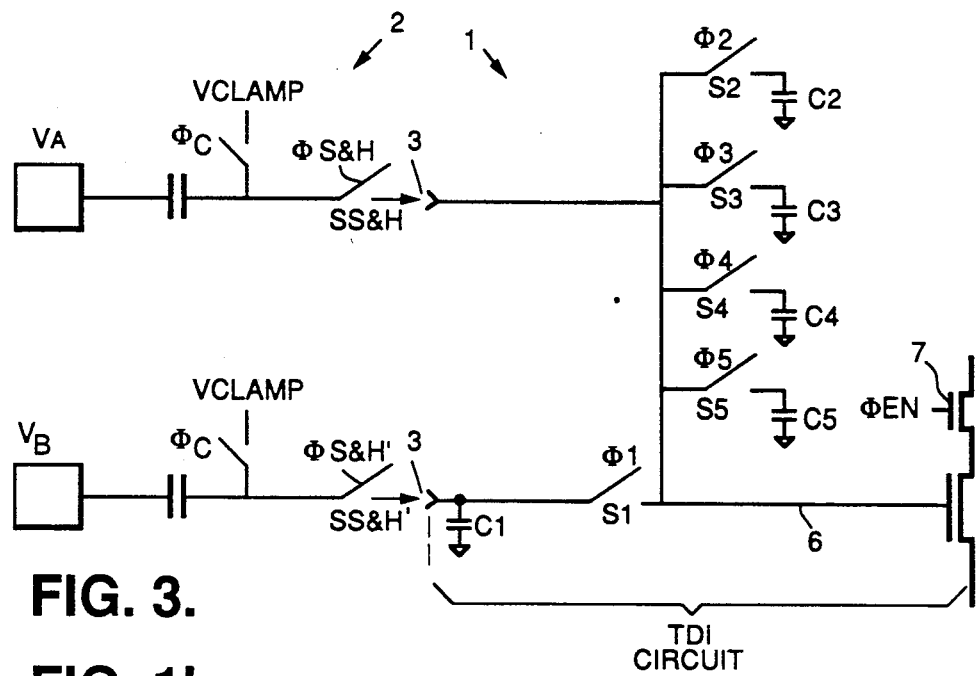
FIG. 3.
FIG. 1b.
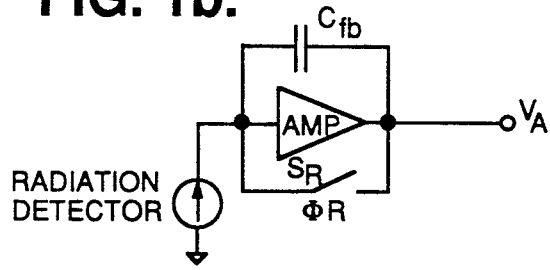
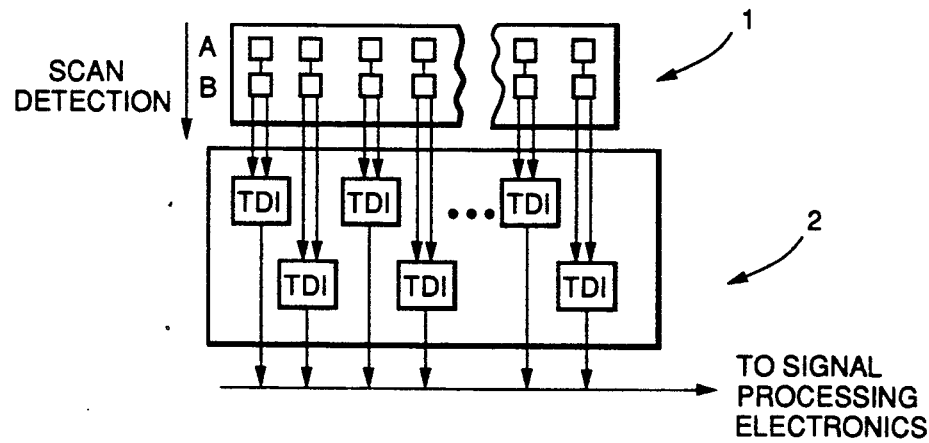
FIG. 1c.

HOLD CAPACITOR TIME DELAY AND INTEGRATION WITH EQUILIBRATING MEANS

FIELD OF THE INVENTION

This application relates generally to radiation detector read-out circuitry and, in particular, to charge domain summing circuitry, and to methods of operating same, for achieving a time delay and integration (TDI) function.

BACKGROUND OF THE INVENTION

A TDI function operates on the premise that two or more radiation detector channels, which are disposed colinearly in a scan direction and which view the same part of a scene during a given scan, will exhibit relative signal levels that are correlated, although separated in time. However, the noise associated with each channel is not correlated. By temporal phasing (a time delay function) and adding the radiation detector channel signals (an integration function) the resultant output signal has been found to exhibit a signal-to-noise ratio that is superior to that of a single detector channel. This is because the signals sum, but the noise is root sum squared, resulting in a signal-to-noise ratio improvement equal to the square root of the number of detectors.

By example, it is assumed that a bright "spot" moves, due to the scanning process, from a detector A to a detector B. The spot covers detector A at some time $T_1$ and a sample of detector A is taken at that time. At some later time, $T_1+t$, the spot covers detector B and another sample is taken. By adding the sample from detector A, obtained at time $T_1$, to the sample from detector B, obtained at time $T_1+t$, a higher signal-to-noise ratio estimate of the intensity of the spot is obtained.

Many conventional imaging systems implement the TDI function by causing all of the detectors to simultaneously take a sample of what the detectors are "seeing". This is often accomplished by sampling the detector circuitry through a switch that is coupled to a hold capacitor. When the switch is closed the voltage of the signal is placed on the capacitor. When the switch is opened this voltage remains on the capacitor until the switch is once more closed.

Conventional approaches for implementing the TDI function typically employ charge coupled devices (CCDs) or bucket-brigade device (BBD) circuits. However, CCD circuits require different and/or additional processing than does conventional MOS device fabrication. In addition, both types of conventional circuits suffer from transfer inefficiencies when the number of detector channels in TDI, that is samples per pitch, becomes large.

Commonly assigned U.S. Pat. No. 4,970,567, entitled "Method and Apparatus for Detecting Infrared Radiation", issued Nov. 13, 1990 (W. L. Ahlgren et al.) discloses a monolithic structure for detecting radiation having a substrate having read out signal processing electronics integrated thereon.

It is thus an object of the invention to provide TDI apparatus and method that overcomes the problems inherent in CCD and BBD techniques.

SUMMARY OF THE INVENTION

The foregoing and other problems are overcome and the object of the invention is realized by circuitry for realizing a TDI function without employing a CCD or BBD structure. As a result, detector channel amplifier circuitry may be constructed with standard MOS processing techniques. In addition, the circuitry of the invention is not susceptible to transfer inefficiencies found in CCD and BBD implementations.

Furthermore, the use of the invention provides detector channel circuitry having, relative to conventional CCD technology, a simplified layout and processing, increased radiation hardness, and, when compared to BBD techniques, lower output data rates of higher signal-to-noise ratio quality, thereby simplifying interfacing requirements and increasing system performance.

The TDI circuit of the invention employs sample and hold capacitors that are addressed in alternating fashion to provide a temporal analog memory to realize the TDI function. The TDI circuit furthermore provides an averaging function by coupling the capacitors together and allowing the stored charge to equilibrate.

In accordance with a method of the invention, and circuitry for realizing same, there is disclosed the performance of a TDI function with a plurality of electrical signals. A first step of the method stores, during individual ones of a first plurality of consecutive time intervals, a sample of a first electrical signal. A second step of the method equilibrates, during individual ones of a second, subsequent plurality of time intervals, one of the stored samples with a stored sample of a second electrical signal. Subsequent to each of the steps of equilibrating an electrical signal is outputted that has a magnitude expressive of the equilibrated stored samples.

The equilibration achieved by shorting storage capacitors together effectively sums coherent signals and incoherent noise. In accordance with the invention the charge sum is stored on a capacitance that is effectively doubled from either detector channel operating individually. Thus, the output signal remains in the same range as would be an individual detector channel output voltage, without TDI, and no reduction in dynamic range is incurred.

BRIEF DESCRIPTION OF THE DRAWING

The above set forth and other features of the invention are made more apparent in the ensuing Detailed Description of the Invention when read in conjunction with the attached Drawing, wherein:

FIG. 1b is a simplified schematic diagram showing an integrating amplifier coupled to a radiation detector;

FIG. 1c illustrates an exemplary 64×2 array of radiation sensors having a scan direction as illustrated;

FIG. 3 is a simplified schematic diagram illustrating a two detector TDI embodiment having three samples per pitch.

DETAILED DESCRIPTION OF THE INVENTION

Figure 1A:
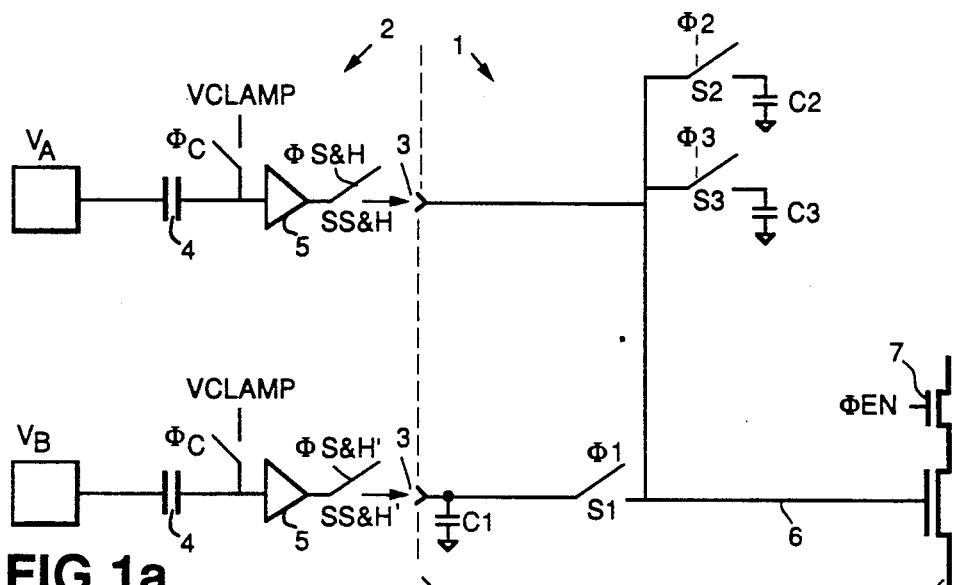
FIG. 1a is a simplified schematic diagram illustrating a two detector TDI embodiment having one sample per pitch.
Figure 2:
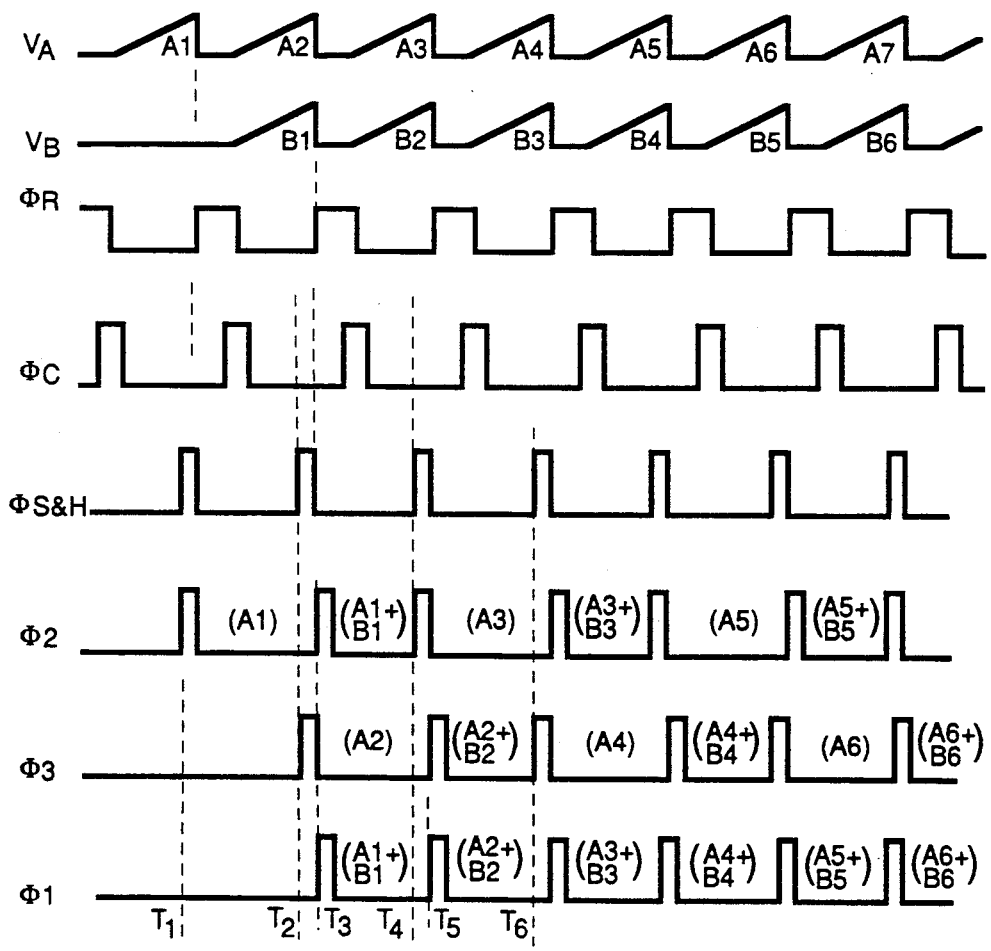
FIG. 2 is a timing diagram that illustrates the operation of the circuit of FIG. 1.

Reference is made to FIG. 1a which shows a simplified schematic diagram illustrating a two detector TDI embodiment having one sample per pitch and also to FIG. 2 which illustrates a timing diagram for the circuit of FIG. 1a.

The TDI circuit array 1 is coupled during use to a radiation detector array 2. Although two detector signals $V_A$ and $V_B$ are illustrated, a typical array has significantly more than two detectors and, as a result, correspondingly more TDI circuits are provided on the array 1. The array 1 is typically comprised of silicon and MOS processing techniques are employed to fabricate the capacitors, FET switches, column driver transistors and other related circuitry thereon. Typical values for the capacitors are application specific and range from tenths of picofarads, for low flux levels, to several picofarads. In that the capacitors are integrated together on a common substrate and in close proximity to one another a tolerance between the capacitor values is typically in the range of approximately one percent. Furthermore, in that during use the capacitors are fed from an effective voltage source, for equal signal inputs approximately equal values of charge are stored by each capacitor receiving the voltage input.

The two arrays are coupled together by, for example, a plurality of indium bump interconnects 3. The detector array 2 may be a linear FPA of detectors including coupling capacitors 4 and source follower (SF) amplifiers 5.

FIG. 1b illustrates a typical integration reset amplifier (AMP) having an input coupled to a radiation detector and an output for expressing the detector signal $V_A$ or $V_B$. In operation, the application of the reset signal $\phi R$ (FIG. 2) closes the reset switch ($S_R$) resetting AMP. Next, $S_R$ is opened and detector current is integrated on $C_{fb}$, resulting in the output voltage, for example $V_A$, appearing as a ramp function. The output voltage is sampled, as described below, and $S_R$ is once more closed. This process is repeated for each detector sample.

By example only, the radiation detectors A and B may be responsive to infrared (IR) radiation and a rotating scanning mirror may be employed to scan the scene across the array. FIG. 1c illustrates an exemplary $64 \times 2$ array of radiation sensors with the scan direction as illustrated. For each vertically disposed pair of detectors A and B that are colinearly disposed along the scan axis a TDI circuit is provided. The composition of the detectors and the method of scanning the scene across the detectors is not germane to an understanding of the invention and will not be further discussed.

Referring to FIG. 1a and FIG. 2, and in accordance with the example given previously, at time $T_1$, when the "bright" spot is over detector A, both switches S&H and S&H' momentarily close, as does switch $S_2$. In the timing diagrams, a signal beginning with ($\phi$) indicates a signal applied to a switch to activate the switch. For example, the signal $\phi 2$ is the activating signal for switch $S_2$. Also, the signal $\phi C$ is employed to couple the input of the source follower (SF) to a reference voltage (V clamp) at the beginning of the integration period The purpose of V clamp is to set the output voltage to a known potential and to remove effects of low frequency noise.

After switches S&H and S&H' open capacitor $C_2$ has stored a "sampled" estimate of the spot intensity viewed by detector A while capacitor $C_1$ has stored a sample of the background intensity viewed by detector B. At $T_2$ the spot is over detector B. Switches S&H and S&H' are once more momentarily closed, as is $S_3$. After these switches open an estimate of the spot intensity as viewed by detector B is held on capacitor $C_1$ and an estimate of the background intensity as viewed by detector A is held on $C_3$.

Thus, at this time there is an estimate of the spot intensity held on $C_2$, taken at time $T_1$, and an estimate of the spot intensity held on $C_1$, taken at time $T_2$. At time $T_3$, and before the next L sample is taken, $S_1$ and $S_2$ are closed and the voltages appearing across $C_2$ and $C_1$ are allowed to equilibrate. This results in an average estimate of the spot intensity appearing on the signal out line 6. An enabling signal ($\phi$EN) is applied to an output switch 7 to enable the equilibrated and averaged spot intensity to be output to further signal processing stages (not shown). In practice, the application of $\phi$EN follows the application of $\phi 2$ and $\phi$ by some interval of time, for example several ten's of nanoseconds, in order to allow equilibration.

The equilibration achieved by shorting the capacitors together effectively sums coherent signals and incoherent noise, which is the basic premise for TDI. In accordance with the invention the charge sum is stored on a capacitance that is effectively doubled from either detector channel operating individually. Thus, the voltage to the output switch 7 remains in the same range as would be an individual detector channel output voltage, without TDI, and no reduction in dynamic range is incurred.

In practice, the phasing of the clocks for switches $S_2$ and $S_3$ alternate so that there is always maintained an "old" sample of what detector A was seeing which can thus be averaged with what B is seeing currently. As can be seen in FIG. 2 at tim $T_4$ switches S&H and S&H' are momentarily closed, as is also switch 2. Thus, the image intensity as viewed by detector A is stored on $C_2$ and that viewed by detector B is stored on $C_1$. At time $T_5$ switches $S_3$ and $S_1$ are closed allowing the charge previously stored on $C_3$ at $T_2$ and the charge stored on $C_1$ at tim $T_4$ to equilibrate and be placed on the output line 6. At $T_6$ the switches S&H and S&H' are momentarily closed as is switch $S_3$. The operation of the circuit thereafter continues as previously described for times $T_3-T_5$.

It can be seen that the TDI circuit of the invention employs sample and hold capacitors in conjunction with proper clock phasing to provide a temporal memory to realize the TDI function. That is, the invention employs a plurality of sample and hold capacitors, addressed in alternating fashion to provide an analog memory, and couples selected ones of the capacitors together such that the resulting voltage equilibrium provides the signal averaging function.

FIG. 3 illustrates a schematic for a two detector TDI circuit employing three samples per pitch. The embodiment of FIG. 3 may be employed for those applications that require additional sampling during the time that the spot moves from detector A to detector B. The additional switches and hold capacitors thus serve as additional analog memory elements. In this case four sample and hold capacitors ($C_2-C_5$) store the previous three samples as well as a present sample of detector A. The stored samples are sequentially equilibrated with a present sample from detector B that is stored on $C_1$. In all other respects the operation is the same as that depicted in FIGS. 1a and 2.

Figure 4A:
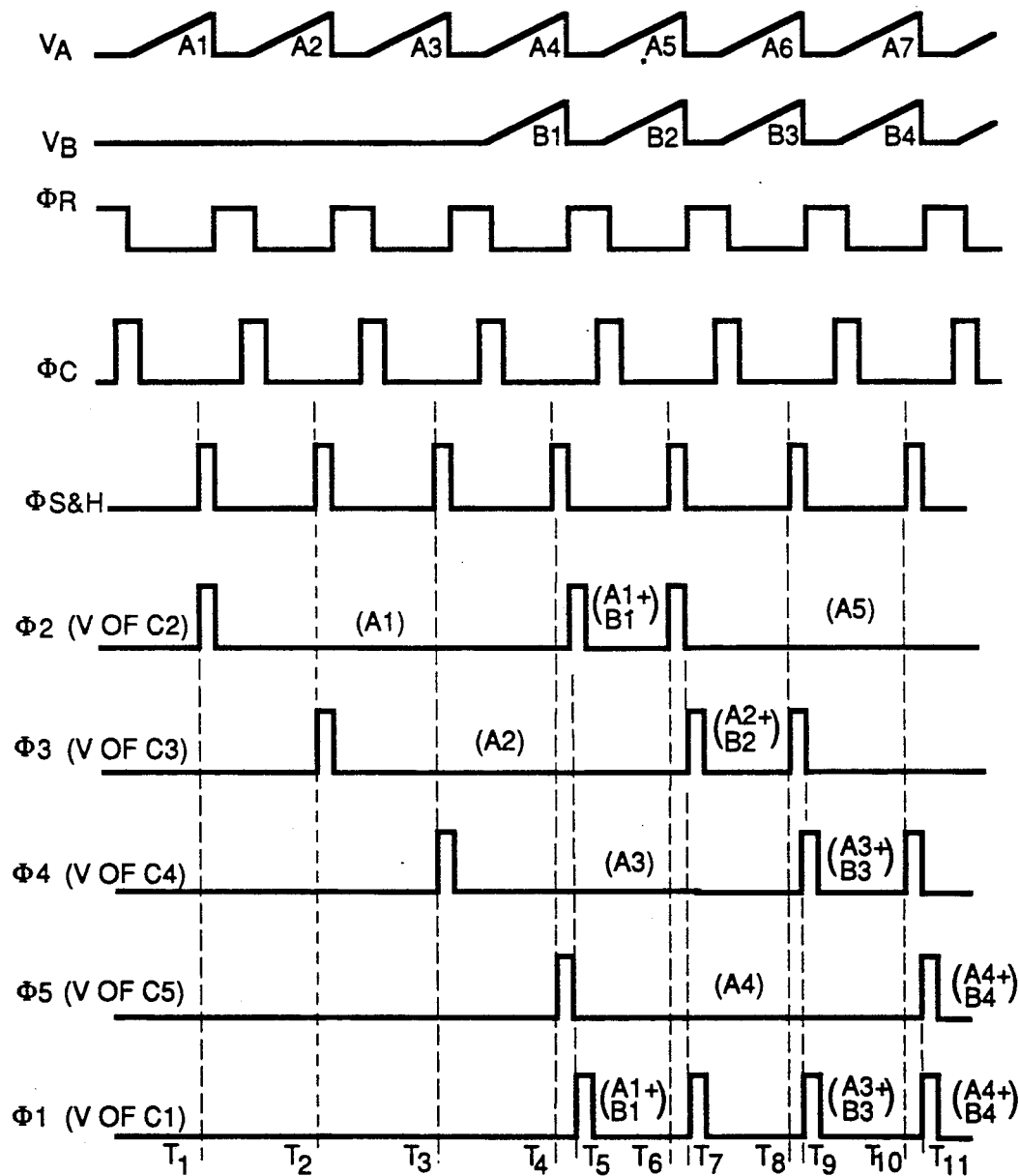
FIGS. 4a and 4b are a timing diagram illustrating the operation of the circuit of FIG. 3.
Figure 4B:
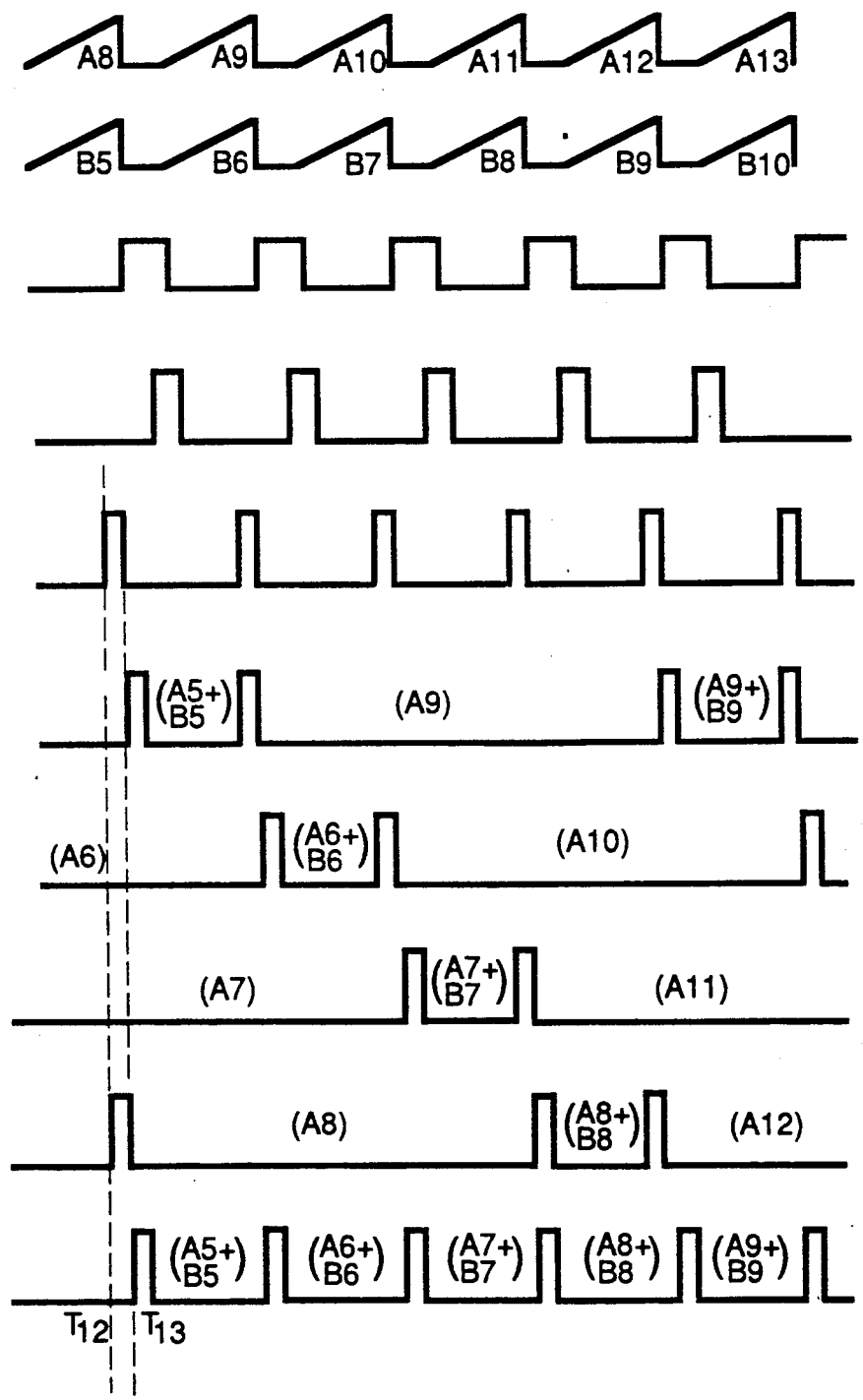

Referring to FIGS. 4a and 4b there is illustrated the timing for the TDI circuit of FIG. 3. At $T_1$ switches S&H and S&H' are momentarily closed as is $S_2$. As a result, the scene intensity viewed by detector A is stored on $C_2$ and the intensity viewed by detector B is stored on $C_1$. At time $T_2$ switches S&H and S&H' are once more momentarily closed as is switch $S_3$. As a result the scene intensity viewed by detector A is stored on $C_3$, the scene intensity viewed at $T_1$ remaining on $C_2$. At time $T_3$ switches S&H and S&H' are once more momentarily closed as is switch $S_4$. As a result the scene intensity viewed by detector A at $T_3$ is stored on $C_4$, the scene intensities viewed at $T_1$ and $T_2$ remaining on $C_2$ and $C_3$, respectively. At time $T_4$ switches S&H and S&H' are once more momentarily closed as is switch $S_5$. As a result the scene intensity viewed by detector A at $T_4$ is stored on $C_5$, the scene intensities viewed at $T_1$, $T_2$ and $T_3$ remaining on $C_2$, $C_3$ and $C_4$, respectively. At time $T_2$, $T_3$ and $T_4$ the closing of S&H' also stores the scene viewed by detector B on $C_1$. At $T_5$ switches $S_2$ and $S_1$ are momentarily closed allowing the charges on $C_1$ and $C_2$ to equilibrate, it being remembered that the charge on $C_2$ was stored at $T_1$. The averaged voltage is provided to the output line 6 for application to further electronic readout circuitry. At $T_6$ switches S&H and S&H' are momentarily closed as is switch $S_2$. This places the scene intensity viewed by detector A at $T_6$ on $C_2$ and the intensity viewed by detector B on $C_1$. At $T_7$ switches $S_3$ and $S_1$ are momentarily closed permitting the charge placed on $C_3$ at time $T_3$ to equilibrate with the charge placed on $C_1$ at $T_6$. The resulting voltage is provided to the output line. At $T_8$ switches S&H and S&H' are momentarily closed as is switch $S_3$. This places the scene intensity viewed by detector A at $T_8$ on $C_3$ and the intensity viewed by detector B on $C_1$. At $T_9$ switches $S_4$ and $S_1$ are momentarily closed permitting the charge placed on $C_4$ at time $T_4$ to equilibrate with the charge placed on $C_1$ at $T_8$. The resulting voltage is provided to the output line. At $T_{10}$ switches S&H and S&H' are momentarily closed as is switch $S_4$. This places the scene intensity viewed by detector A at $T_{10}$ on $C_4$ and the intensity viewed by detector B on $C_1$. At $T_{11}$ switches $S_5$ and $S_1$ are momentarily closed permitting the charge placed on $C_5$ at time $T_4$ to equilibrate with the charge placed on $C_1$ at $T_{11}$ and the resulting voltage is provided to the output line. At $T_{12}$ switches S&H and S&H' are momentarily closed as is switch $S_5$. This places the scene intensity viewed by detector A at $T_{12}$ on $C_5$ and the intensity viewed by detector B on $C_1$. At $T_{13}$ switches $S_2$ and $S_1$ are momentarily closed permitting the charge placed on $C_2$ at time $T_6$ to equilibrate with the charge placed on $C_1$ at $T_{12}$. The resulting voltage is provided to the output line. Thereafter, the timing sequence continues as previously described.

It should be realized that the teaching of the invention may be employed to sample more than two detectors and that more than two or four samples per pitch may be employed. Also, it is within the scope of the invention to cascade the disclosed TDI circuits such that the output signal line from two or more of the TDI circuits is input to a further TDI stage. As such, and while the invention has been particularly shown and described with respect to preferred embodiments thereof, it will be understood by those skilled in the art that changes in form and details may be made therein without departing from the scope and spirit of the invention.

What is claimed is:

1. A method of performing a time delay and integration function with a plurality of electrical signals, comprising the steps of:

storing, during individual ones of a first plurality of consecutive time intervals, a sample of a first electrical signal;

equilibrating, during individual ones of a second, subsequent plurality of time intervals, one of the stored samples with a stored sample of a second electrical signal; and outputting, subsequent to each of the steps of equilibrating, an electrical signal having a magnitude that is expressive of the equilibrated stored samples.

2. A method as set forth in claim 1 wherein each step of storing includes a step of switchably coupling one of a plurality of first capacitances to the first electrical signal.

3. A method as set forth in claim 2 wherein each of the steps of equilibrating includes an initial step of switchably coupling a second capacitance to the second electrical signal.

4. A method as set forth in claim 3 wherein the step of equilibrating includes a step of switchably coupling one of the first capacitances to the second capacitance.

5. A method of performing a time delay and integration function with a plurality of electrical signals, comprising the steps of:

storing on a first charge storage means during a first time interval a charge expressive of a magnitude of a first electrical signal;

storing on a second charge storage means during a second, subsequent time interval a charge expressive of a magnitude of the first electrical signal while also storing on a third charge storage means a charge expressive of a magnitude of a second electrical signal;

equilibrating during a third, subsequent time interval the charge stored on the first charge storage means and the charge stored on the third charge storage means to derive a first resultant electrical signal; and reading out the first resultant electrical signal.

6. A method as set forth in claim 5 and further comprising the steps of:

storing on the first charge storage means during a fourth, subsequent time interval a charge expressive of a magnitude of the first electrical signal while also storing on the third charge storage means a charge expressive of a magnitude of the second electrical signal; and equilibrating during a fifth, subsequent time interval the charge stored on the second charge storage means and the charge stored on the third charge storage means to derive a second resultant electrical signal; and reading out the second resultant electrical signal.

7. Apparatus for performing a time delay and integration function with a plurality of electrical signals, comprising:

means for storing a plurality of samples of a first electrical signal, each of the plurality of samples being stored at a different time;

means for storing a sample of a second electrical signal;

means for equilibrating one of the stored samples of the first electrical signal with the stored sample of a second electrical signal; and means for outputting an electrical signal having a magnitude that is expressive of the equilibrated stored samples.

8. Apparatus as set forth in claim 7 wherein the means for storing a sample of the first electrical signal includes a plurality of first capacitances and means for switchably coupling each of the first capacitances individually to the first electrical signal.

9. Apparatus as set forth in claim 8 wherein the means for storing a sample of the second electrical signal includes a second capacitance and means for switchably coupling the second capacitance to the second electrical signal.

10. Apparatus as set forth in claim 9 wherein the means for equilibrating includes means for switchably coupling one of the first capacitances in parallel with the second capacitance.

11. Apparatus as set forth in claim 7 wherein the means for storing are each coupled to means for providing a signal from a first and from a second radiation detector, respectively.

12. Apparatus as set forth in claim 11 wherein the first and the second radiation detectors are colinearly disposed along a scan axis of an array of radiation detectors.

13. Apparatus as set forth in claim 7 wherein the means for storing and the means for equilibrating are integrated upon a common substrate means.

14. Apparatus as set forth in claim 13 wherein the common substrate means includes means for coupling the substrate means, during use, to an array of radiation detectors.

* * * * *